United States Patent
Miyanishi et al.

(10) Patent No.: US 9,728,272 B2
(45) Date of Patent: Aug. 8, 2017

(54) SEMICONDUCTOR DEVICE, TEST PROGRAM, AND TEST METHOD

(71) Applicant: Renesas Electronics Corporation, Koutou-ku, Tokyo (JP)

(72) Inventors: Atsushi Miyanishi, Tokyo (JP); Yuichiro Ishii, Tokyo (JP); Yoshisato Yokoyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/000,027

(22) Filed: Jan. 18, 2016

(65) Prior Publication Data

US 2016/0254062 A1 Sep. 1, 2016

(30) Foreign Application Priority Data

Feb. 26, 2015 (JP) ................... 2015-036297

(51) Int. Cl.

| G11C 11/00 | (2006.01) |
|---|---|
| G11C 29/04 | (2006.01) |
| G11C 29/46 | (2006.01) |
| G11C 29/02 | (2006.01) |
| G11C 11/419 | (2006.01) |
| G11C 11/412 | (2006.01) |
| G11C 11/413 | (2006.01) |

(Continued)

(52) U.S. Cl.
CPC ............. *G11C 29/04* (2013.01); *G11C 7/04* (2013.01); *G11C 11/412* (2013.01); *G11C 11/413* (2013.01); *G11C 11/419* (2013.01); *G11C 29/02* (2013.01); *G11C 29/34* (2013.01); *G11C 29/46* (2013.01); *G11C 29/48* (2013.01); *G11C 29/50* (2013.01); *G11C 11/417* (2013.01); *G11C 29/06* (2013.01)

(58) Field of Classification Search
CPC ... G11C 11/412; G11C 11/413; G11C 11/419; G11C 8/10; G11C 8/08; G11C 8/12; G11C 8/14; G11C 11/4085; G11C 29/50; G11C 29/02; G11C 29/34; G11C 29/48; G11C 29/46
USPC .................... 365/154, 230.06, 201
See application file for complete search history.

(56) References Cited

U.S. PATENT DOCUMENTS

| 6,781,907 B2* | 8/2004 | Marr | ........................ G11C 11/39 327/538 |
|---|---|---|---|
| 7,872,930 B2* | 1/2011 | Chen | ........................ G11C 29/50 365/154 |

(Continued)

FOREIGN PATENT DOCUMENTS

JP 2010-244659 A 10/2010

*Primary Examiner* — Pho M Luu
(74) *Attorney, Agent, or Firm* — Shapiro, Gabor and Rosenberger, PLLC

(57) ABSTRACT

When a screening test at a normal temperature is performed instead of a low temperature screening test of SRAM, overkill is reduced and risk of outflow of defects due to local variation is suppressed. An SRAM including a word line, a bit line pair, a memory cell, and a drive circuit that drives the bit line pair is provided with a function that can drive one bit line of the bit line pair at a high level (VDD) potential and drive the other bit line at an intermediate potential (VSS+ several tens mV to one handled and several tens mV) a little higher than a low level (VSS) potential for normal writing when writing data into the memory cell.

14 Claims, 16 Drawing Sheets

(51) Int. Cl.
*G11C 29/34* (2006.01)
*G11C 29/48* (2006.01)
*G11C 29/50* (2006.01)
*G11C 7/04* (2006.01)
G11C 11/417 (2006.01)
G11C 29/06 (2006.01)

(56) References Cited

U.S. PATENT DOCUMENTS

| | | | | |
|---|---|---|---|---|
| 8,509,006 B2 * | 8/2013 | Yamada | ................. | G11C 29/02 |
| | | | | 365/189.07 |
| 8,553,488 B2 * | 10/2013 | Campbell | ................ | G11C 8/08 |
| | | | | 365/201 |
| 8,976,608 B2 * | 3/2015 | Ono | ......................... | G11C 7/00 |
| | | | | 365/189.06 |

* cited by examiner

SEMICONDUCTOR DEVICE, TEST PROGRAM, AND TEST METHOD

CROSS-REFERENCE TO RELATED APPLICATIONS

The disclosure of Japanese Patent Application No. 2015-036297 filed on Feb. 26, 2015 including the specification, drawings and abstract is incorporated herein by reference in its entirety.

BACKGROUND

The present invention relates to a semiconductor device, a test program, and a test method. In particular, the present invention is preferably used for a test technique that selects defects at a low temperature of an SRAM (Static Random Access Memory) mounted on the semiconductor device by performing a test at normal temperature instead of a test at low temperature.

In related art, regarding an inexpensive semiconductor device, test cost may be reduced by omitting a test at a low temperature (for example, 0° C. or below) in a screening test before shipping. This is because in a semiconductor manufacturing process in related art, in an SRAM memory cell, many circuit operation failures due to manufacturing defects such as insufficient static noise margin (SNM) tend to occur at a high temperature and there is no problem even if the test at a low temperature is omitted. For a test item where an operation at a low temperature is the hardest, a technique is provided in which a power supply voltage or the like by which the same operation condition as that in the low temperature is realized in normal temperature is obtained in advance and a normal temperature test is performed as an alternative to the test item.

Japanese Unexamined Patent Application Publication No. 2010-244659 discloses a test technique that changes a word line potential into a voltage corresponding to a temperature at which measurement should be performed based on a temperature-word line potential conversion table which is prepared in advance and provided and in which a corresponding relationship between the temperature and the word line potential is described.

SUMMARY

The inventors have studied Japanese Unexamined Patent Application Publication No. 2010-244659, and as a result the inventors have found that there are new problems as described below.

FIG. 1 shows a circuit of an SRAM memory cell having a typical six-transistor configuration. A memory cell MC is coupled to a word line WL, a bit line pair (BT and BB), a power supply line VDD that supplies power, and a ground line VSS. The memory cell MC includes two invertors whose inputs are respectively coupled to outputs of the other invertors by two storage nodes (node A and node B) and two transfer gates (MN3 and MN4). Each of the two invertors includes a P-channel MOSFET (Metal Oxide Semiconductor Field Effect Transistor) (MP1 or MP2) and an N-channel MOSFET (MN1 or MN2). The P-channel MOSFET (MP1 or MP2) is called a load MOS. The N-channel MOSFET (MN1 or MN2) is called a drive MOS. The two transfer gates are comprised of two N-channel MOSFETs (MN3 and MN4), in each of which a gate electrode is coupled to the word line WL, a source electrode is coupled to one of the two storage nodes (node A and node B), and a drain electrode is coupled to one of the two bit lines (BT and BB) that forms a bit line pair. In the MOSFET referred to in the present specification, the source electrode and the drain electrode are electrically symmetrical, so that the electrodes may be called the opposite name. This only means that when one of the source electrode and the drain electrode is called the source electrode, the other electrode is called the drain electrode.

FIG. 2 is a waveform diagram showing an operation when data is written to the SRAM memory cell MC in FIG. 1. A selection signal is asserted on the word line WL and voltages corresponding to write data are complementarily applied to the bit line pair (BT and BB). In the memory cell MC selected by the word line WL, the applied voltages are respectively written to the storage nodes (node A and node B) from the bit line pair (BT and BB). FIG. 2 shows an example in which a high level is applied to the bit line BT, a low level is applied to the bit line BB, and levels held by the storage nodes (node A and node B) are inverted. In a non-defective device, the node A transitions from a power supply (VDD) potential, which is a high level, to a ground (VSS) potential, which is a low level, and conversely the node B transitions from the VSS potential to the VDD potential.

When a failure occurs in a path between the node B and the power supply line VDD in this circuit, in a data writing operation to the memory cell MC, there is a fault in which when data to be held at high level is written to the node B, the potential of the node B does not rise to the same potential as the power supply VDD and the potential remains at an intermediate potential (see "defective storage node" in FIG. 2). The failure is assumed to be a case in which a threshold voltage of the P-channel MOSFET (MP2) which is a load MOS is abnormally high and an ON-state current is low and a case in which a high-resistance portion due to partial disconnection or the like exists on the path. This failure becomes conspicuous at a low temperature in particular. To discriminate the failure, a test is performed at a low temperature or a test is performed by lowering the power supply voltage to a voltage at which the failure occurs at a normal temperature.

When performing a low temperature screening test, a facility to cool a semiconductor element to be tested (to, for example, −20° C. to −40° C.) is required and a testing time increases because the screening test needs to be performed at three temperatures of high, normal, and low temperatures. As a result, there occurs a problem that a testing cost increases.

The problem that the testing cost increases is solved by performing a screening test at a normal temperature instead of the low temperature screening test. When performing an alternative of the low temperature screening test at a normal temperature, a guard band needs to be provided in voltage. FIG. 3 is a characteristic diagram showing a temperature dependency of a transistor current in a typical transistor (MOSFET). The horizontal axis represents a power supply voltage VDD and the vertical axis represents a transistor current (Tr Current; drain current in a case of MOSFET). Regarding this transistor, when a lower limit voltage of operation according to the specifications is defined as VDD_MIN, a transistor current at a normal temperature (for example, 25° C.) at the lower limit voltage VDD_MIN is greater than a transistor current at a low temperature (for example, target current at −40° C.) at the lower limit voltage VDD_MIN. To match the transistor current at the normal temperature to the transistor current at the low temperature, a guard band which further lowers the power supply voltage by α V from VDD_MIN needs to be used. Here, in general, α V is several tens mV.

The inventors have studied such a screening test at a normal temperature which can be an alternative of the low temperature screening test, and as a result the inventors have found that there are new problems as described below.

When a guard band which lowers the power supply voltage is provided, a current driving capability of not only a transistor whose current driving capability needs to be lowered but also all the transistors is lowered. Therefore, a semiconductor chip that results in an operation error due to a cause other than original test items occurs, so that it is found that there occurs a problem that causes so-called overkill, in which originally non-defective semiconductor chips are also determined to be defective in addition to defective semiconductor chips that are desired to be excluded. For example, in the SRAM memory cell MC shown in FIG. 1, when a test in which a guard band which lowers the power supply voltage is provided is performed in order to detect a failure as shown in "defective storage node" in FIG. 2 resulting from degradation of the current driving capability of the P-channel MOSFET (MP2) which is a load MOS, a cell current during memory reading decreases accordingly and sensitivity of a sense amplifier degrades, so that there is a risk that the SRAM memory cell MC is determined to be defective.

Further, it is found that the overkill occurs more remarkably when miniaturization of a semiconductor element is progressed. That is to say, in a recent miniaturization process, it is found that many circuit operation failures due to manufacturing of SRAM memory cell occur also at a low temperature due to large local variation.

FIG. 4 is an illustration schematically showing a relationship between transistor current and local variation and their temperature dependency. The horizontal axis represents the transistor current and the vertical axis represents the local variation. The characteristics at a normal temperature (25° C.) and a low temperature (−40° C.) are shown. In a process in which the local variation is dominant, the temperature dependency of transistor characteristics near the median (0σ) and the temperature dependency of transistor characteristics in a region where the variation is large (6σ) are different from each other. It is found that the local variation of transistor current at a low temperature (−40° C.) is greater than that at a normal temperature (25° C.). Therefore, it is found that risk of outflow of defects increases in a screening test in which a guard band is set based on characteristics near the median (0σ).

While the means to solve the above problems will be described below, the other purposes and the new features will become clear from the description of the present specification and the accompanying drawings.

An embodiment of the invention is as follows.

An SRAM including a word line, a bit line pair, a memory cell, and a drive circuit that drives the bit line pair is provided with a function that can drive one bit line of the bit line pair at a high level potential and drive the other bit line at an intermediate potential higher than a low level potential for normal writing and lower than the high level potential when writing data into the memory cell.

A brief description of the effects obtained from the embodiment is as follows.

When a screening test at a normal temperature is performed instead of a low temperature screening test of SRAM, it is possible to reduce the overkill and suppress the risk of outflow of defects due to local variation.

DETAILED DESCRIPTION

Embodiments will be described in detail.

First Embodiment

Figure 1:
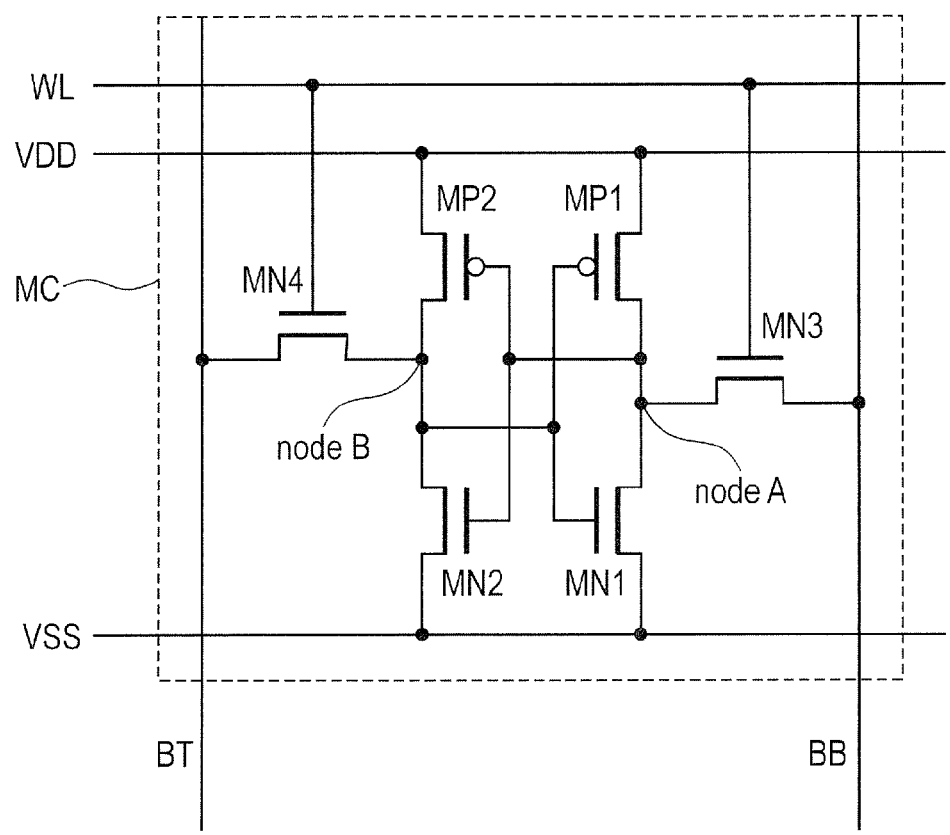
FIG. 1 shows a circuit diagram of an SRAM memory cell having a typical six-transistor configuration.
Figure 5:
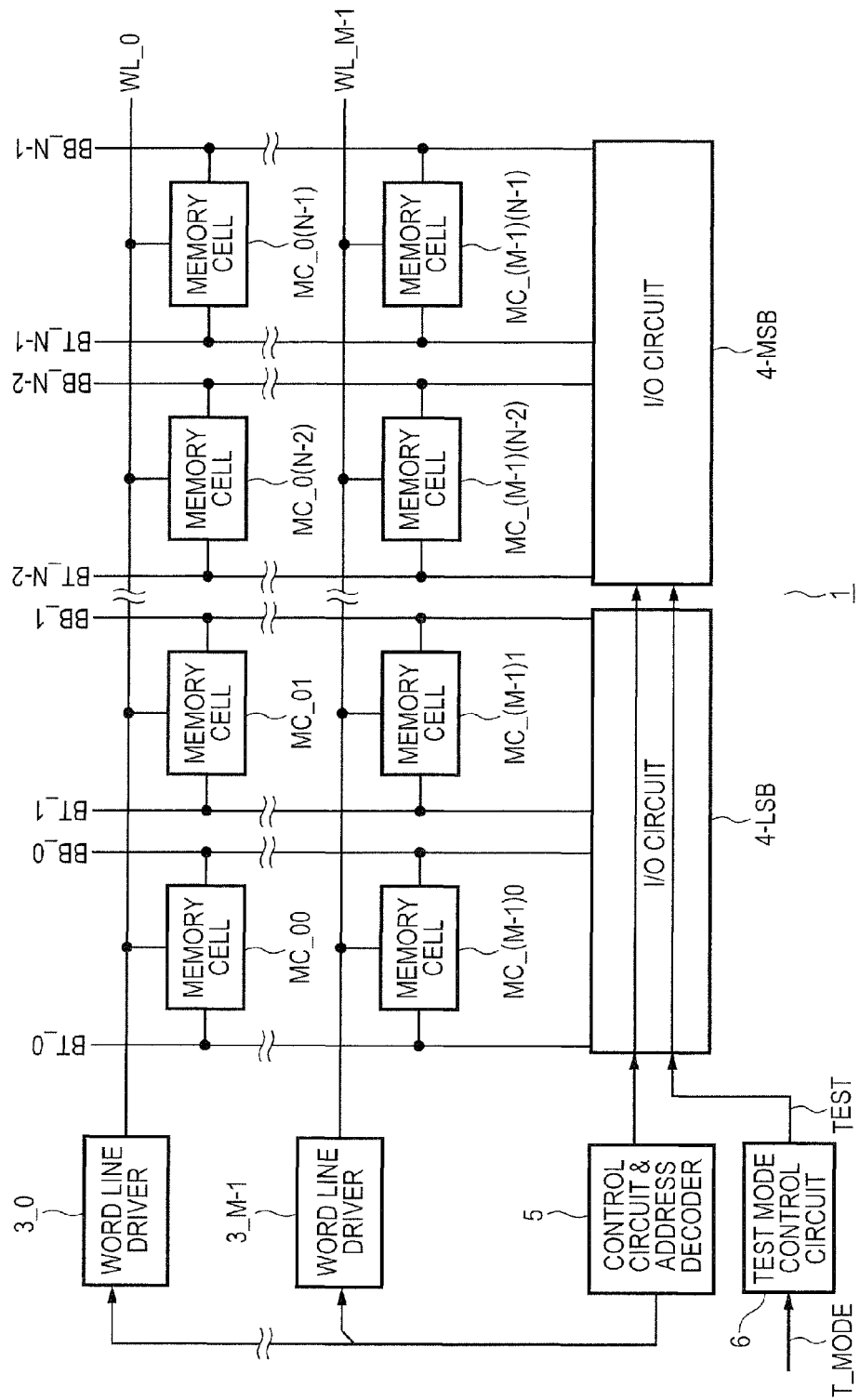
FIG. 5 is a block diagram showing a configuration example of an SRAM module which is an object to be tested.

FIG. 5 is a block diagram showing a configuration example of an SRAM module 1 which is an object to be tested. In the first embodiment, the single-port SRAM module 1 of M words×N bits (M and N are integers) will be described. The SRAM module 1 includes memory cells MC00 to MC_(M-1)(N-1), I/O circuits 4_LSB (LSB: Least Significant Bit) and 4_MSB (MSB: Most Significant Bit), word line drivers 3_0 to 3_M-1, a control circuit & address decoder 5, and a test mode control circuit 6. The SRAM module 1 includes include word line WL_0 to WL_M-1 and bit line pairs BT_0 to BT_N-1 and BB_0 to BB_N-1. In the SRAM module 1, the memory cells MC00 to MC_(M-1)(N-1) are coupled to portions where a word line and a bit line pair intersect with each other. The word line drivers 3_0 to 3_M-1 assert a word selection signal on one word line selected based on a decoding result of the address decoder 5 from among word lines WL_0 to WL_M-1 respectively coupled to the word line drivers 3_0 to 3_M-1. To "assert a word selection signal" when the memory cell MC includes, for example, a transfer gate of N-channel MOSFET as shown in FIG. 1 means to drive the word line at high level (normally, at the VDD potential). The I/O circuits 4_LSB is coupled to the memory cells MC00 to MC_(M-1)0, MC01 to MC_(M-1)1, and so forth on the lower bit (LSB) side. The I/O circuits 4_MSB is coupled to the memory cells MC . . . , MC0_(N-2) to MC_(M-1)(N-2), and MC0_(N-1) to MC_(M-1)(N-1) on the upper bit (MSB) side. The I/O circuit 4_LSB and the I/O circuit 4_MSB are coupled to the control circuit & address decoder 5 for read/write control and are further provided with a test mode signal TEST from the test mode control circuit 6 that is controlled by a test mode switching signal T_MODE in order to control a normal operation mode or a test mode.

The memory cell MC and the I/O circuit 4 will be described in more detail.

Figure 6:
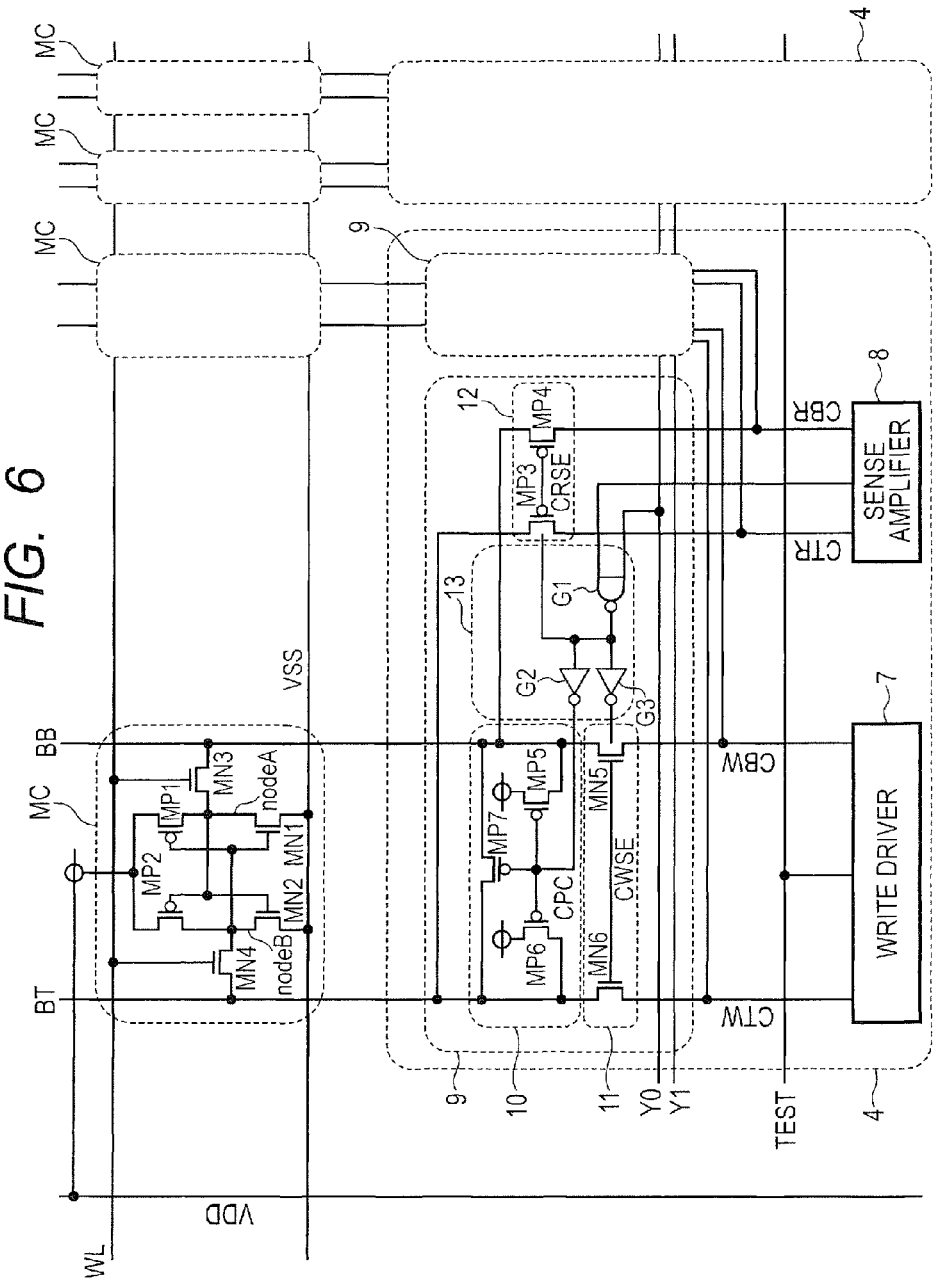
FIG. 6 is a configuration diagram showing a circuit configuration example of an I/O circuit and a memory cell drawn by focusing attention on one memory cell.

FIG. 6 is a configuration diagram showing a circuit configuration example of the I/O circuit 4 and the memory cell MC drawn by focusing attention on one memory cell. In the memory cell MC on which the attention is focused and the I/O circuit 4 coupled to the memory cell MC, a write driver 7, a sense amplifier 8, and a column I/O circuit 9, which are coupled to the memory cell MC, are shown. The column I/O circuit 9 includes a precharge circuit 10, a write column switch 11, a read column switch 12, and a column I/O control circuit 13. CTW and CBW are a common write bit line pair. CTR and CBR are a common read bit line pair. Y0 and Y1 are Y address selection signals. CPC is a precharge control signal. CWSE is a write switch control signal. CRSE is a read switch control signal.

Figure 2:
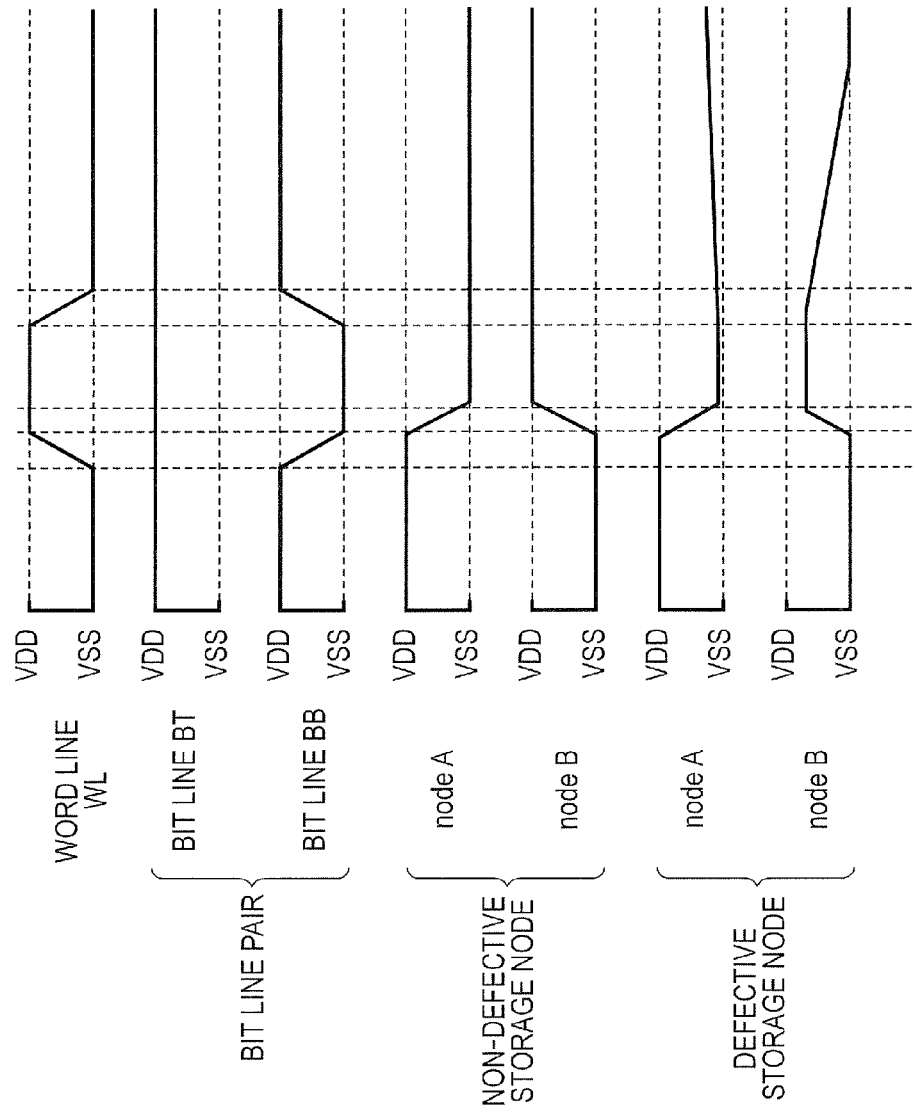
FIG. 2 is a waveform diagram showing an operation when data is written to the SRAM memory cell in FIG. 1.
Figure 3:
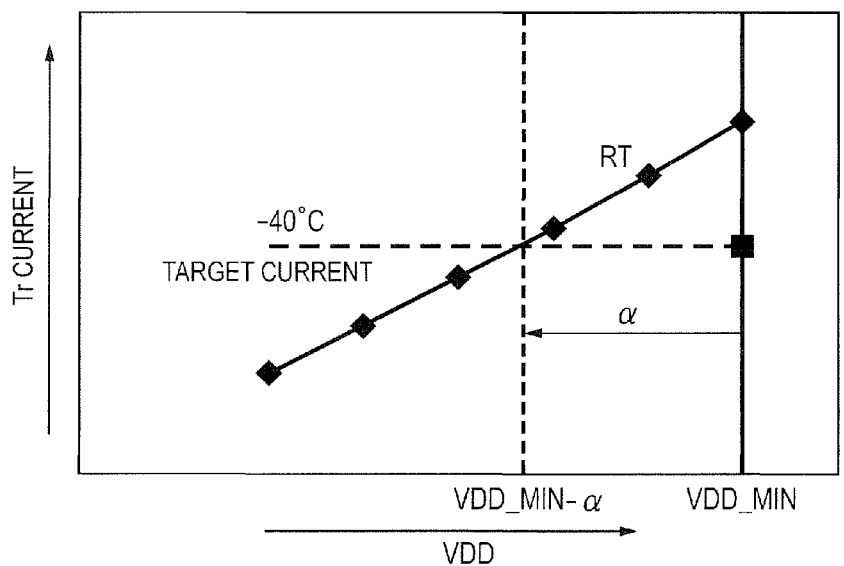
FIG. 3 is a characteristic diagram showing a temperature dependency of a transistor current in a typical transistor (MOSFET).
Figure 4:
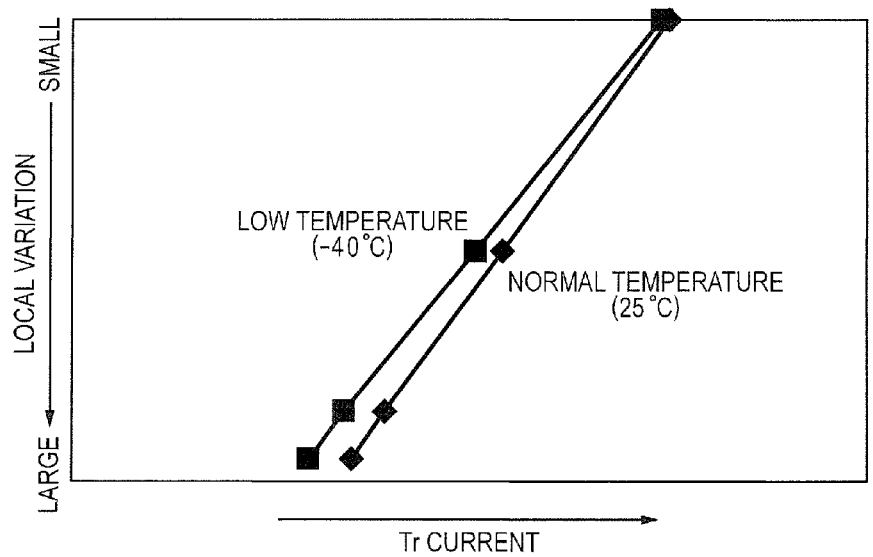
FIG. 4 is an illustration schematically showing a relationship between transistor current and local variation and their temperature dependency.

Although not shown in FIG. 6, as illustrated in FIG. 2, the SRAM module 1 includes the control circuit & address decoder 5 and the word line drivers 3_0 to 3_M-1. FIG. 6 shows only one word line WL that is driven by the word line driver 3 and omits the other word lines and the memory cells MC coupled to the other word lines. The same goes for a column direction. FIG. 6 shows the I/O circuits 4 for only two bits. However, the I/O circuits 4 may be further arranged in the in the column direction. FIG. 6 shows an example in which one I/O circuit 4 includes two column I/O circuits 9. In other words, although a circuit of MUX2 is illustrated, the circuit may be changed to a configuration including a larger number of selection circuits, such as, for example, a configuration of MUX4 or MUX8. The test mode signal TEST is inputted into the write driver 7. The write driver 7 is provided with a circuit that can raise and drive a lower level line of the bit line pair of BT and BB to a potential (intermediate potential) higher than VSS in the test mode.

The intermediate potential is a potential at which a memory cell MC that is non-defective in a normal operation mode and is defective at a low temperature is detected as defective at a normal temperature. The intermediate potential is set based on a circuit simulation and/or an experiment and is a potential higher than VSS by several tens mV to one handled and several tens mV (for example, 20 mV to 120 mV) and lower than VDD. In the memory cell MC including two invertors whose inputs are respectively coupled to outputs of the other invertors by two storage nodes (node A and node B) and two transfer gates (MN3 and MN4) as shown in FIG. 6, when a potential of a storage node that should be normally inverted by a potential inputted from the bit line pair BT and BB through the transfer gates (MN3 and MN4) is not inverted, it is determined that the memory cell MC is defective. In such a memory cell MC, as described above, the failure is assumed to be a case in which a threshold voltage of the P-channel MOSFET (MP1 and/or MP2) which is a load MOS is abnormally high and an ON-state current is low and a case in which a high-resistance portion due to partial disconnection or the like exists on the path. This failure becomes conspicuous at a low temperature in particular, so that in a normal operation mode, although the memory cell MC operates normally at a normal temperature, the memory cell MC becomes defective at a low temperature. In the test mode, by raising and driving the lower level line of the bit line pair of BT and BB to a potential (intermediate potential) higher than VSS, a driving capability that changes the storage node from the low level to the high level is weakened and the writing is impeded. Therefore, the test mode is a pseudo-low-temperature test mode, so that the test is called a pseudo-low-temperature screening test. At this time, it is possible to selectively apply stress to writing that changes the storage node from the low level to the high level, and no stress is applied to the other circuits such as the sense amplifier. In this way, it is possible to selectively apply stress to an element to be an object of a test item as compared with a related art test that simulates a low temperature state by a normal temperature test by applying stress by lowering the power supply voltage of the entire memory module. Therefore, it is possible to suppress occurrence of the overkill in which a normal operation of a peripheral circuit other than the element be an object of a test item is impeded and the operation is detected as a failure.

The operation of the SRAM module 1 will be described in more detail.

Figure 7:
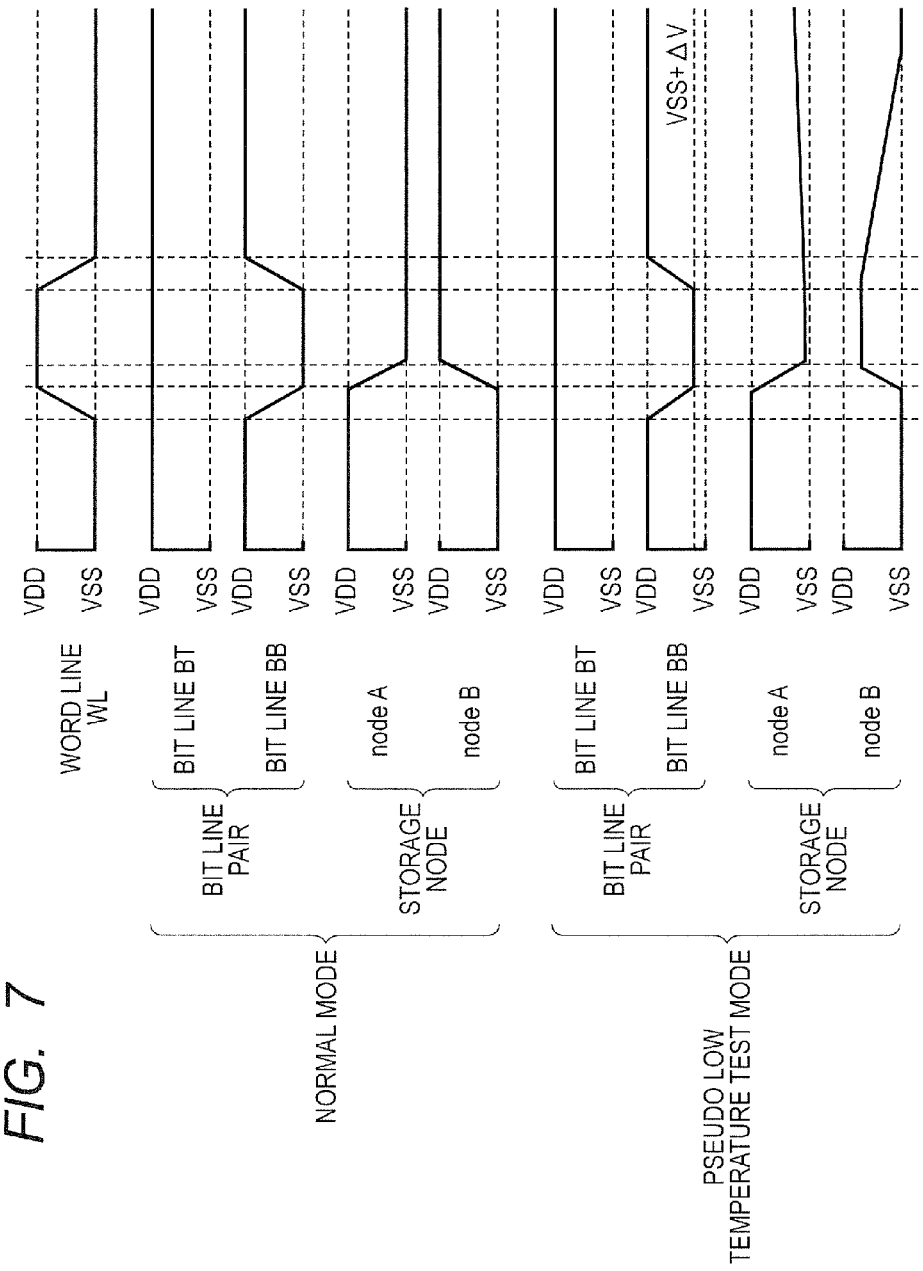
FIG. 7 is a waveform diagram showing an operation when data is written to the SRAM memory cell in FIG. 6.

FIG. 7 is a waveform diagram showing an operation when data is written to the SRAM memory cell MC in FIG. 6.

In a writing operation in the normal operation mode, the write driver 7 outputs a signal for writing to the bit line pair BT and BB through a common write bit line pair CTW and CBW (not shown in FIG. 7), drives one bit line of the bit line pair at a high level (VDD potential), and drives the other bit line of the bit line pair at a low level (VSS potential). At substantially the same time, the word line driver 3 is driven to cause the word line WL to rise. This is to assert a word line selection signal. Levels of the node A and the node B which are storage nodes of the memory cell MC selected by the assertion are reversed, so that data is written. After the data is written, the word line WL is caused to fall and the bit line pair BT and BB are precharged, so that one cycled is completed. In this writing operation, the potential of a bit line which is one of the bit line pair BT and BB and which is set to low is set to the VSS (GND) level.

On the other hand, in a pseudo-low-temperature test mode, a bit line potential of low side is raised from the VSS (GND) level by several tens mV to one handled and several tens mV (VSS+ΔV). As a result, as shown in FIG. 7, the potential of the internal node A which becomes low after rewriting does not fall to the VSS (GND) level, but becomes the raised potential (VSS+ΔV). The raised potential (VSS+ΔV) is applied to the gate (node A) of the P-channel MOSFET (MP2) which is a load MOS in the memory cell MC in FIG. 6, so that on-resistance between source and drain of the P-channel MOSFET (MP2) becomes greater than when the VSS (GND) is applied. Therefore, the node B is inhibited to be raised to a high level.

The writing is inhibited in this way, so that when writing capability is insufficient (when there is a failure (defect) in a path through which an electric current is supplied from the power supply VDD to the node B), a writing stress is applied and a normal writing operation cannot be performed. Therefore, it is possible to exclude a defective product which operates normally at a normal temperature but becomes defective at a low temperature by discriminating the defective product by a test at a normal temperature.

To cause a defect to be more apparent, immediately after the writing where stress is applied is performed, (in the next cycle), a read operation may be performed on the same address.

Figure 8:
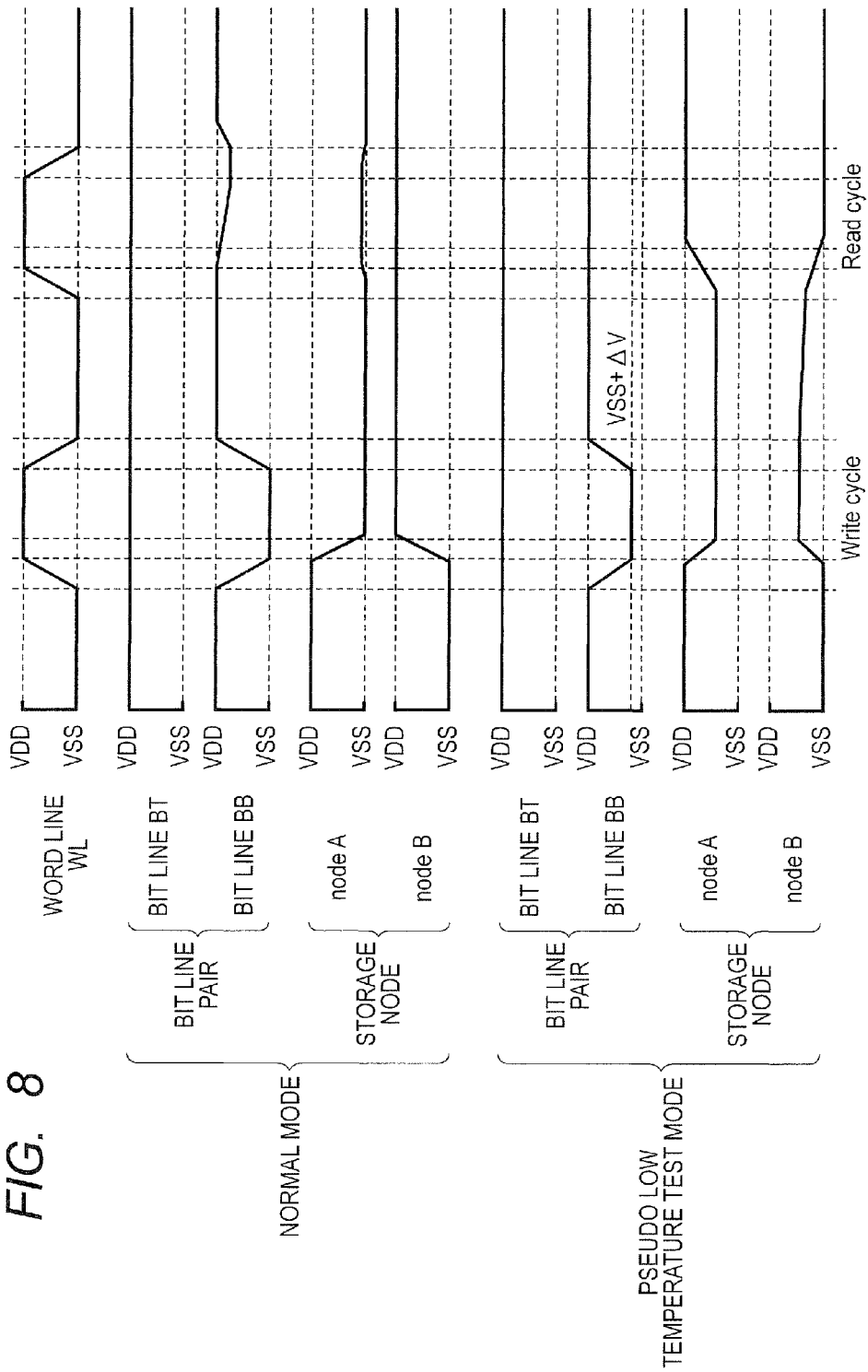
FIG. 8 is a waveform diagram showing a modified example (a read cycle is added immediately after a write cycle) of an operation when data is written to the SRAM memory cell in FIG. 6.

FIG. 8 is a waveform diagram showing a modified example (a read cycle is added immediately after a write cycle) of an operation when data is written to the SRAM memory cell in FIG. 6.

In the normal operation mode, in a read cycle added immediately after a write cycle, the word line WL is caused to rise for the same memory cell MC as a memory cell where writing is performed (assertion of the word selection signal). Accordingly, the level of the node A that is a storage node is read out to the line BB and the level of the node B is read out to the bit line BT. In the example described above, a low level is written to the node A and a high level is written to the node B, so that the low level is read from the node A to the bit line BB and the potential of the bit line BB is lowered. At this time, the potential of the node A rises somewhat because a current flows into the node A from the precharged bit line BB.

Also in the pseudo-low-temperature test mode, in a read cycle added immediately after a write cycle, the word line WL is caused to rise for the same memory cell MC as a memory cell where writing is performed (assertion of the word selection signal). Accordingly, the level of the node A that is a storage node is read out to the line BB and the level of the node B is read out to the bit line BT. At this time, if the memory cell has a failure at a low temperature and internal writing is not fully completed, the level of the node A does not drop to the VSS (GND) level and the level of the node B does not rise to VDD. At this time point, a read cycle is performed on the same memory cell MC and the word line WL rises, so that the node A and the node B are coupled to the precharged bit line pair BB and BT through the transfer gates (MN3 and MN4), respectively. In the normal operation mode, the potential of the node A rises only somewhat because a current flows into the node A from the precharged bit line BB. However, when the internal writing is not fully completed, the level of the node A is inverted by the current flowing from the bit line BB, and accordingly the level of the node B is also inverted. In this way, in the memory cell MC which has a failure at a low temperature and whose static noise margin (SNM) is small, data stored by a write operation is evaporated by a read operation immediately after the write operation, so that it is possible to screen out and exclude the memory cell MC as a defective product. In the memory cell MC whose SNM is small as described above, when a certain length of time elapses after the write operation, there is a case in which the level of the node A drops to the VSS (GND) level, the level of the node B rises to VDD to be stable, and the memory cell MC cannot be screened out and excluded as defective in a read operation thereafter. When a read cycle is added immediately after a write cycle in the pseudo-low-temperature test mode, it is possible to appropriately exclude such an unstable failure as described above.

The test method described above is described by using a predetermined control language for a test program and is described as a test pattern. A semiconductor tester executes the test program on a test target which is a semiconductor chip on which the SRAM described above is mounted, so that the test method is performed. Instead of the execution of the test program by the semiconductor tester, a test circuit that executes a test sequence equivalent to the test program may be included in the semiconductor chip. The same goes for the embodiments described below.

As described above, when writing is performed on the SRAM memory cell, it is possible to simulatively perform the low temperature screening test on a defective memory cell whose writing capability is insufficient by inhibiting writing by raising a potential of a lower potential bit line of the bit line pair by several tens mV to one handled and several tens mV from a potential in a normal operation, so that it is possible to prevent the overkill by performing the writing by using the same power supply voltage as that in a usual normal temperature test. Further, it is possible to more significantly apply stress on the writing by performing writing in a stress mode describe above and thereafter reading the same address in the next cycle, so that it is possible to appropriately exclude even an unstable defect.

Second Embodiment

A configuration example of a write driver 7, which has a function to raise a potential of a lower potential bit line of the bit line pair by several tens mV to one handled and several tens mV from a potential in a normal operation when performing writing on the SRAM memory cell, will be described.

Figure 9:
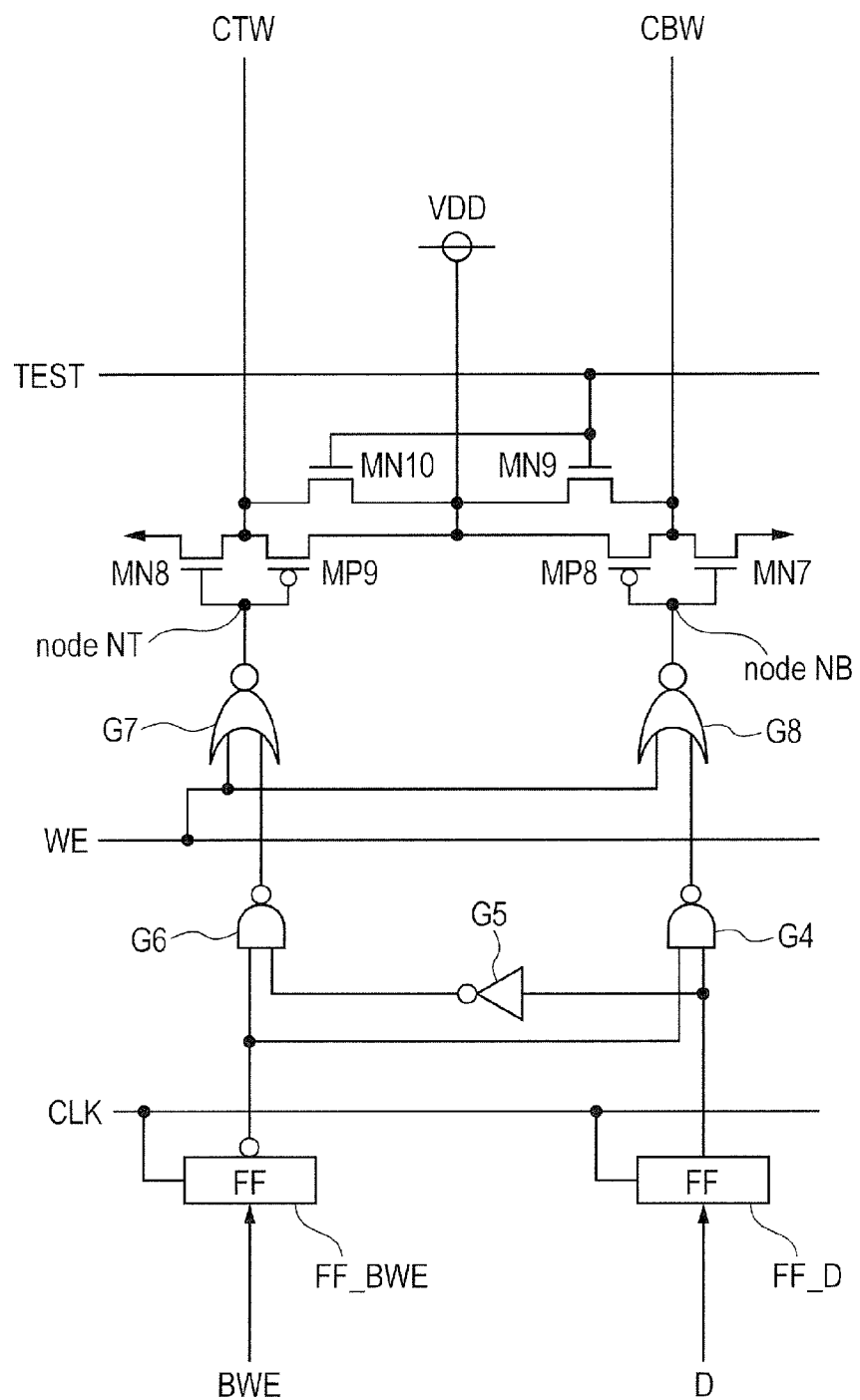
FIG. 9 is a circuit diagram showing a configuration example of a write driver.

FIG. 9 is a circuit diagram showing a configuration example of the write driver 7. A portion of the write driver 7 which corresponds to only one bit is shown. Inputted D represents write data. BWE represents a bit write mask control signal. TEST represents a test mode signal. WE represents a write enable signal. CLK represents a clock. Outputted CTW and CBW represent a common write bit line pair. The write data D and the bit write mask control signal BWE are inputted into corresponding flip-flops FF_D and FF_BWE, respectively, in synchronization with the clock CLK. The write data D inputted into the flip-flop FF_D is outputted to the common write bit line pair CTW and CBW at complementary logical levels by logical gates G4 to G8. However, in a state in which the bit write mask control signal BWE is asserted, the write data D is masked and a high level is outputted to both the common write bit line pair CTW and CBW. The bit write mask function can be omitted. FIG. 9 is an example in which one bit write mask control signal BWE is inputted for one bit. However, it may be configured so that one bit write mask control signal BWE is inputted for each plurality of bits, such as eight bits and nine bits. When one bit write mask control signal BWE is inputted for each byte, a byte write mask function is provided.

In the same manner as a normal write driver, the write driver 7 includes two invertors that invert inputted levels of nodes NT and NB, respectively, and output the inverted levels to the common write bit line pair CTW and CBW. The two invertors includes a P-channel MOSFET (MP9), an N-channel MOSFET (MN10), a P-channel MOSFET (MP8), and an N-channel MOSFET (MN9). The write driver 7 of the present embodiment further includes two N-channel MOSFETs (MN9 and MN10) that couples the common write bit line pair CTW and CBW to the power supply VDD when the test mode signal TEST becomes high in the pseudo-low-temperature test mode.

Driving capabilities of the two N-channel MOSFETs (MN9 and MN10) controlled by the test mode signal TEST are respectively represented by their channel widths W2B and W2, and driving capabilities of the two N-channel MOSFETs (MN7 and MN8) that form two inverters are respectively represented by their channel widths W1B and W1. In the pseudo-low-temperature test mode in which the test mode signal TEST is asserted, the inverters that drive the common write bit line pair CTW and CBW to a low level and the N-channel MOSFETs (MN7 and MN8) conflict with each other, so that it is possible to raise a lower level line of the bit line pair coupled to the common write bit line pair from the VSS (GND) potential by several tens mV to one handled and several tens mV (it is possible to raise the lower level line to an intermediate potential). When a low level is outputted to CTW and a high level is outputted to CBW, the N-channel MOSFET (MN10) coupled to CTW to which the low level is outputted is also turned on, so that an actual potential (intermediate potential) of CTW is determined by a difference between the channel width W2 of the N-channel MOSFET (MN10) and the channel width W1 of the N-channel MOSFET (MN8) that forms an inverter. On the other hand, when a high level is outputted to CTW and a low level is outputted to CBW, the N-channel MOSFET (MN9) coupled to CBW to which the low level is outputted is also turned on, so that an actual potential (intermediate potential) of CBW is determined by a difference between the channel width W2B of the N-channel MOSFET (MN9) and the channel width W1B of the N-channel MOSFET (MN7) that forms an inverter.

In the above description, a method for adjusting the channel widths W1, W2, W1B, and W2B in order to set a potential of a lower potential bit line of the bit line pair in the pseudo-low-temperature test mode to a desired intermediate potential is described. However, a channel length L may also be adjusted along with the above adjustment. The adjustment of the channel length may be performed by serially coupling two MOSFETs having a normal channel length (L) instead of using a MOSFET that actually has a double channel length 2L.

In this way, by only adding two N-channel MOSFETs (MN9 and MN10) controlled by the test mode signal TEST to a normal write buffer, it is possible to realize a write driver 7 which gives a stress (has a function to raise a potential of a lower potential bit line of the bit line pair by several tens mV to one handled and several tens mV from a potential in a normal operation) when performing writing on the SRAM memory cell.

The operation of the write driver 7 will be described in more detail.

FIGS. 10 and 11 to 13 are waveform diagrams showing an operation example of the write driver 7 shown in FIG. 9.

Figure 10:
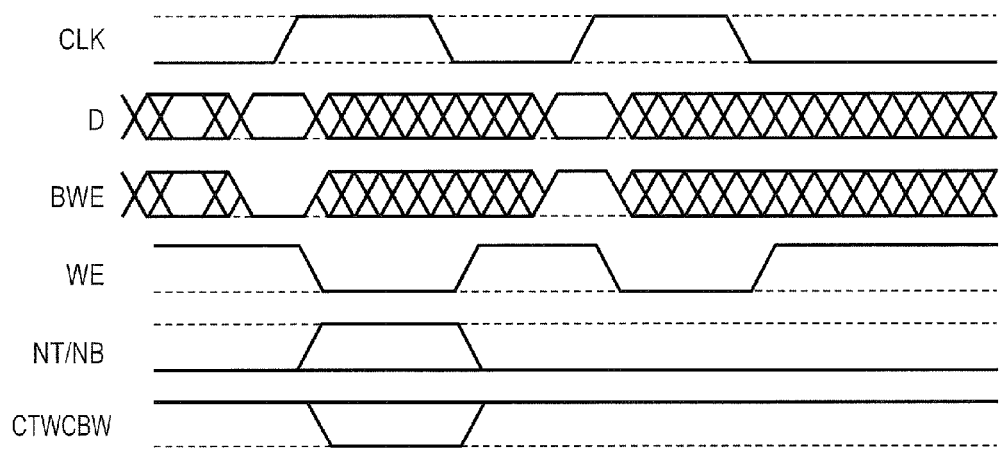
FIG. 10 is a waveform diagram showing an operation example of the write driver shown in FIG. 9.
Figure 11:
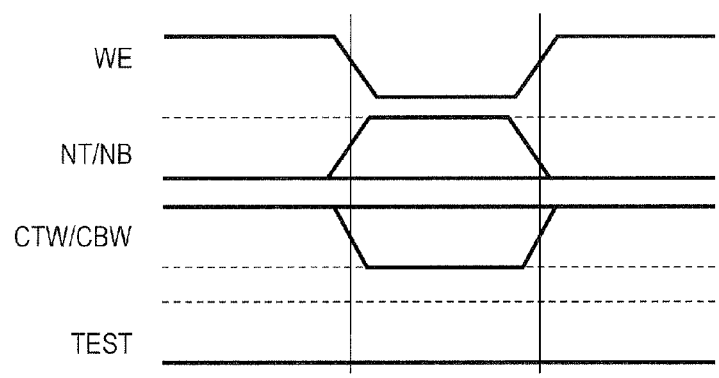
FIG. 11 is a waveform diagram showing an operation example in a normal operation mode of the write driver shown in FIG. 9.

In a writing operation in the normal operation mode shown in FIGS. 10 and 11, when the clock CLK rises, the input signal D is inputted into the flip-flop FF_D and the bit write mask control signal BWE is inputted into the flip-flop FF_BWE. When BWE is enabled (low level), the data D inputted into the flip-flop FF_D is written to the memory cell MC (first half of FIG. 10), and when BWE is disabled (high level), the data D is not written to the memory cell MC (second half of FIG. 10).

The write enable signal WE is high level in an initial stage. At this time, both the internal nodes NT and NB are low level and the common write bit line pair CTW and CBW are high level.

Subsequently, when the write enable signal WE becomes low level, one of the internal nodes NT and NB becomes high level and the other becomes low level, and accordingly one of the common write bit line pair CTW and CBW becomes low level and the other becomes high level.

Thereafter, when the write enable signal becomes high level, both the internal nodes NT and NB become low level and the common write bit line pair CTW and CBW are precharged to high level.

When BWE is enabled (low level) and the data D is written to the memory cell MC, as shown in FIG. 11, the write enable signal WE falls, the internal nodes NT and NB change based on the data D inputted into the flip-flop FF_D, and accordingly the common write bit line pair CTW and CBW are driven. Because of the normal operation mode, the test mode signal TEST is low level and both of the two N-channel MOSFETs (MN9 and MN10) in FIG. 9 are turned off, so that a high common write bit line of the common write bit line pair CTW and CBW is driven to the VDD potential and a low common write bit line of the common write bit line pair CTW and CBW is driven to the VSS (GND) potential.

Figure 12:
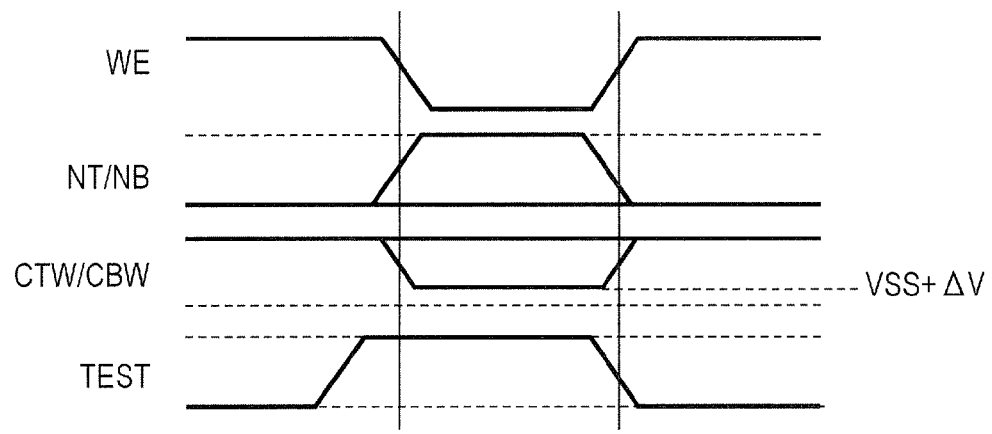
FIG. 12 is a waveform diagram showing an operation example in a pseudo-low-temperature screening test mode of the write driver shown in FIG. 9.

On the other hand, in a pseudo-low-temperature screening test mode, as shown in FIG. 12, the test mode signal TEST is asserted before the write enable signal WE rises and both of the two N-channel MOSFETs (MN9 and MN10) in FIG. 9 are turned on, so that the common write bit line pair CTW and CBW are raised to the VDD potential. The write enable signal WE falls, the internal nodes NT and NB change based on the data D inputted into the flip-flop FF_D, and accordingly the common write bit line pair CTW and CBW are driven. At this time, a signal confliction occurs between MN9 or MN10 and MN7 or MN8 which is an N-channel MOSFET of an inverter that outputs a low level, so that a low common write bit line of the common write bit line pair CTW and CBW becomes an intermediate potential determined by driving capability of MN7, MN8, MN9, and MN10. Thereby, it is possible to apply a stress by raising a potential of a lower bit line by several tens mV to one handled and several tens mV during writing.

As shown in FIG. 12, the test mode signal TEST is controlled by a reverse phase of the write enable signal WE. Regarding the timing of transition, the rise of the test mode signal TEST is the same as or earlier than the rise of the write enable signal WE, and the fall of the test mode signal TEST is the same as the fall of the write enable signal WE.

Figure 13:
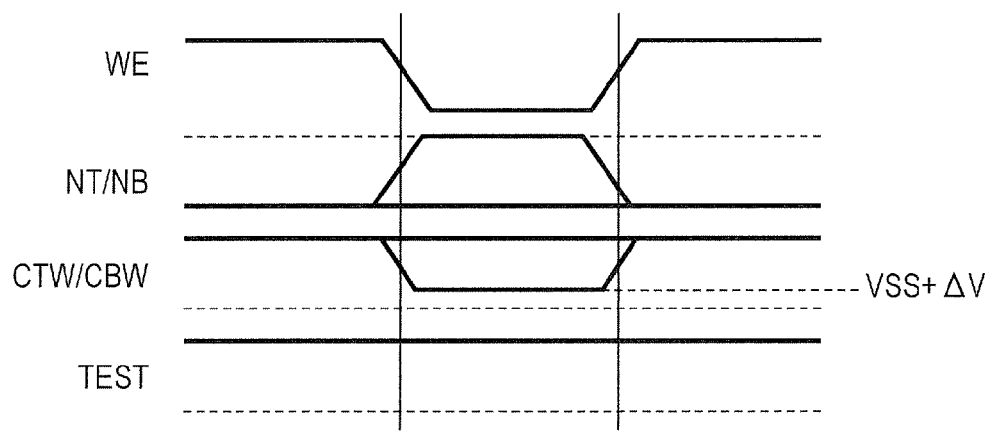
FIG. 13 is a waveform diagram showing another operation example in the pseudo-low-temperature screening test mode of the write driver shown in FIG. 9.

On the other hand, as shown in FIG. 13, the test mode signal TEST may remain fixed to a high level. In the example shown in FIG. 12, during the test mode, it is possible to perform control to switch between the pseudo-low-temperature screening test mode and a usual normal-temperature screening test mode by the test mode signal TEST. On the other hand, in the example shown in FIG. 13, the test mode signal can also be used as a switching control signal between a normal operation mode and a test mode, so that an operation mode switching control circuit is simplified.

As described above, when writing is performed on the SRAM memory cell, the writing is inhibited by raising a potential of a lower potential bit line of the bit line pair by several tens mV to one handled and several tens mV from a potential in a normal operation, so that a circuit configuration preferable to the write driver 7 to realize the pseudolow-temperature screening test mode is provided. Specifically, to raise a bit line, two N-channel MOSFETs (MN9 and MN10) where the source is coupled to VDD, the drain is coupled to the bit line pair, and the gate is coupled to the test mode signal TEST is added to the write driver 7. The driving capability of the two N-channel MOSFETs (MN9 and MN10) is smaller than that of the N-channel MOSFETs (MN7 and MN8) that drive a bit line pair to low, and it is possible to determine a potential (intermediate potential) to raise a lower bit line by balance of the driving capability. In this way, it is possible to realize a stress circuit by only adding the two N-channel MOSFETs (MN9 and MN10).

Third Embodiment

Figure 14:
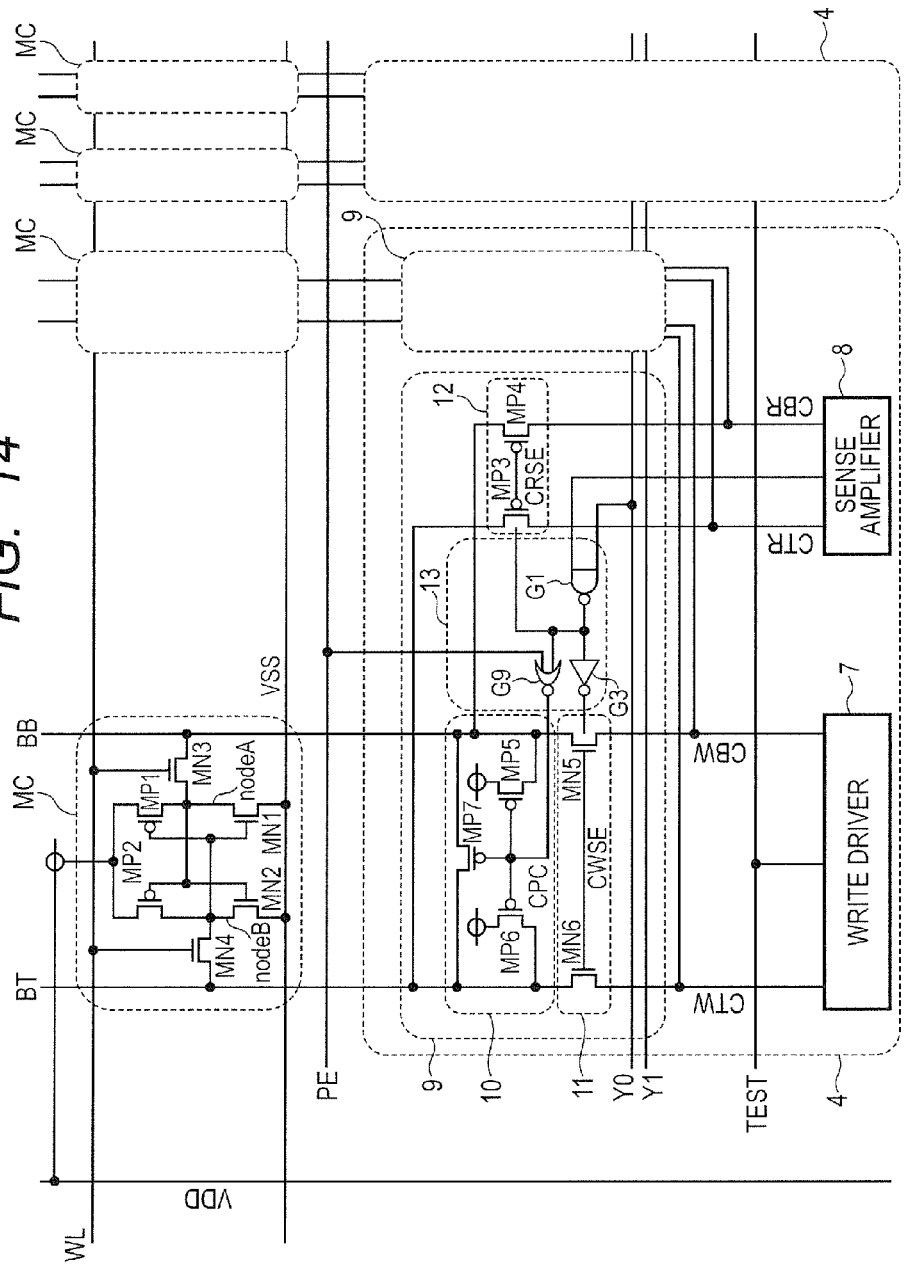
FIG. 14 is a configuration diagram showing another example of a circuit configuration of an I/O circuit and a memory cell drawn by focusing attention on one memory cell.

FIG. 14 is a configuration diagram showing another example of a circuit configuration of the I/O circuit 4 and the memory cell MC drawn by focusing attention on one memory cell. A difference from the configuration example shown in FIG. 6 in the first embodiment is a point that a precharge enable signal PE is added. A logical gate to which the precharge enable signal PE is inputted is changed from an inverter G2 to a NOR gate G9. The other configurations are the same as those shown in FIG. 6, so that the description thereof is omitted.

Figure 15:
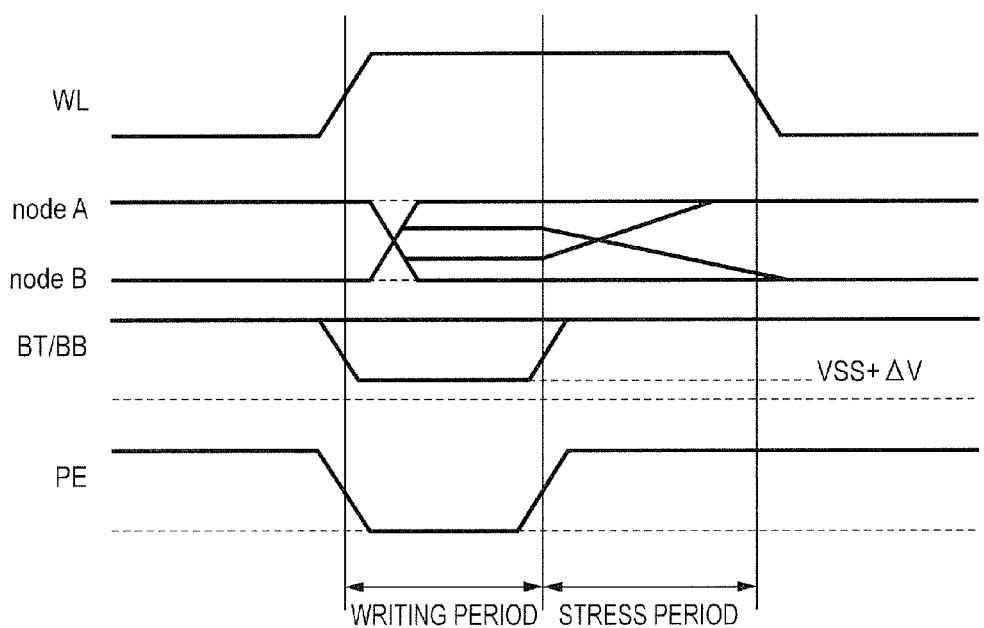
FIG. 15 is a waveform diagram showing a stress operation immediately after writing by the circuit configuration of FIG. 14.

FIG. 15 is a waveform diagram showing a stress operation immediately after the writing by the circuit configuration of FIG. 14.

In the operation example described with reference to FIG. 8 in the first embodiment, the read cycle is added immediately after the write cycle, so that a total of two cycles are required. On the other hand, in the operation example of the third embodiment shown in FIG. 15, in one access period to the memory cell MC, a writing period and a stress period of pseudo-reading are included.

The writing period is a period in which stressed writing is performed in the same manner as in a writing cycle in FIG. 8 of the first embodiment. Specifically, the writing is performed by raising a potential of a lower potential bit line of the bit line pair BT and BB by several tens mV to one handled and several tens mV from a potential in a normal operation. In this period, the precharge enable signal PE is negated and the precharge is turned off.

In the stress period, the word line WL is not caused to fall even after the writing period ends, the precharge enable signal PE is asserted to continuously turn on the precharge of a target bit line pair corresponding to the same memory cell MC, and the bit line pair BT and BB are caused to be the VDD level. As a result of precharging the target bit line pair BT and BB while causing the word line WL to rise, a storage level at the internal nodes A and B evaporates in a memory cell MC which has a defect at a low temperature and in which internal writing is not sufficiently completed. In this way, it is possible to apply a stress to data holding characteristics of the memory cell MC, so that it is possible to cause a defect to be apparent and to more easily screen defective samples.

In the circuit configuration example shown in FIG. 14, the precharge enable signal PE is added. However, instead of using the precharge enable signal PE, it is possible to use the Y address selection signals Y0 and Y1 also as a control signal of the precharge in the configuration example shown in FIG. 6 without change.

Figure 16:
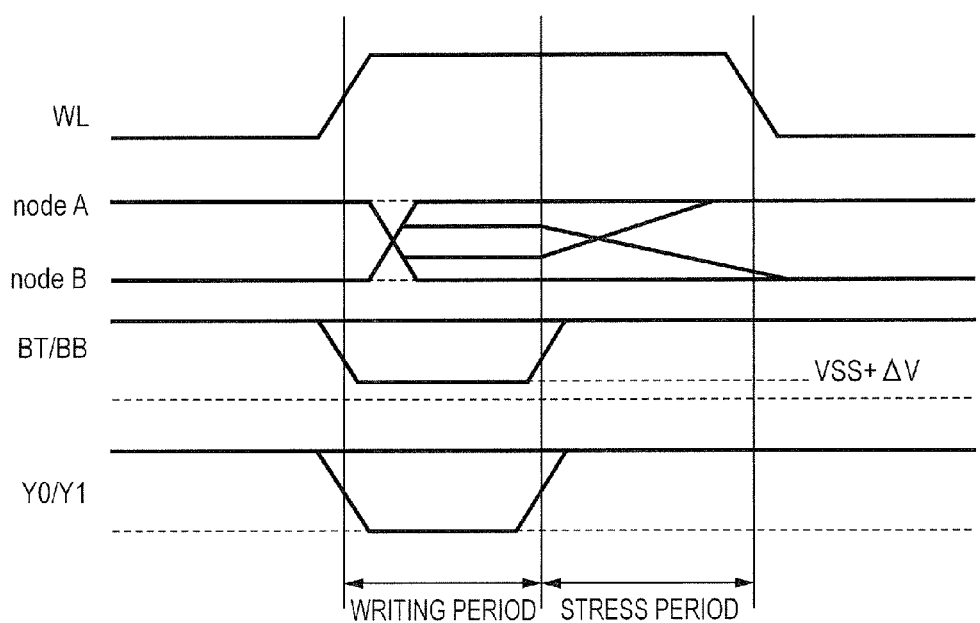
FIG. 16 is a waveform diagram showing a stress operation immediately after writing by the circuit configuration of FIG. 6.

FIG. 16 is a waveform diagram showing a stress operation immediately after the writing by the circuit configuration of FIG. 6.

The writing period is a period in which stressed writing is performed in the same manner as in a writing period in FIG. 15. Specifically, the writing is performed by raising a potential of a lower potential bit line of the bit line pair BT and BB by several tens mV to one handled and several tens mV from a potential in a normal operation. In the precharge period preceding the writing period, all bits are precharged by not selecting both the Y address selection signals Y0 and Y1 instead of asserting the precharge enable signal PE. In the writing period, the precharge is turned off by causing the Y address selection signal Y0 or Y1 of a selected column to be a selected state.

In the stress period, although the word line WL is not caused to fall even after the writing period ends in the same manner as in the stress period in FIG. 15, the bit line pair BT and BB are precharged to the VDD level by not selecting both the Y address selection signals Y0 and Y1 instead of asserting the precharge enable signal PE.

Thereby, the same effect as that of the operation shown in FIG. 15 can be obtained by only changing a control circuit.

As described above, in the pseudo-low-temperature screening test mode in which when writing is performed on the SRAM memory cell, the writing is inhibited by raising a potential of a lower potential bit line of the bit line pair by several tens mV to one handled and several tens mV from a potential in a normal operation, it is possible to continuously perform the stressed writing and a dummy read operation thereafter by one command. Two stress tests can be performed by a normal write command, so that a special test pattern is not required and it is possible to simplify a test pattern used in the screening test. Further, the test time is shortened, so that the test cost can be reduced.

Fourth Embodiment

In the above description, a single-port SRAM is described as an example. However, the test can also be performed on a multi-port SRAM in the same manner. As an example, an embodiment applied to a dual port SRAM will be described.

Figure 17:
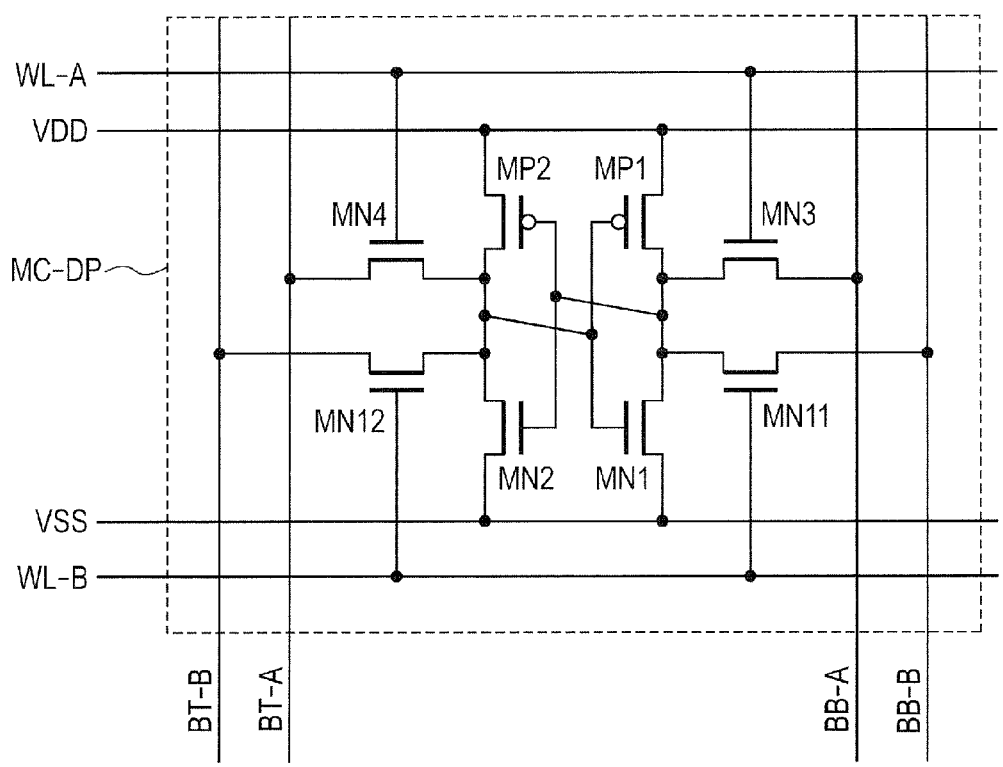
FIG. 17 is a circuit diagram of a dual-port SRAM memory cell having an eight-transistor configuration.

FIG. 17 is a circuit diagram of a dual-port SRAM memory cell MC-DP having an eight-transistor configuration. As compared with a general six-transistor SRAM memory cell shown in FIG. 1, two word lines WL-A and WL-B and two bit line pairs BT-A/BB-A and BT-B/BB-B are provided, and accordingly two N-channel MOSFETs (MN11 and MN12) that function as transfer gates are added. The other configurations and operations are the same as those of the single-port SRAM memory cell, so that the description thereof is omitted.

Figure 18:
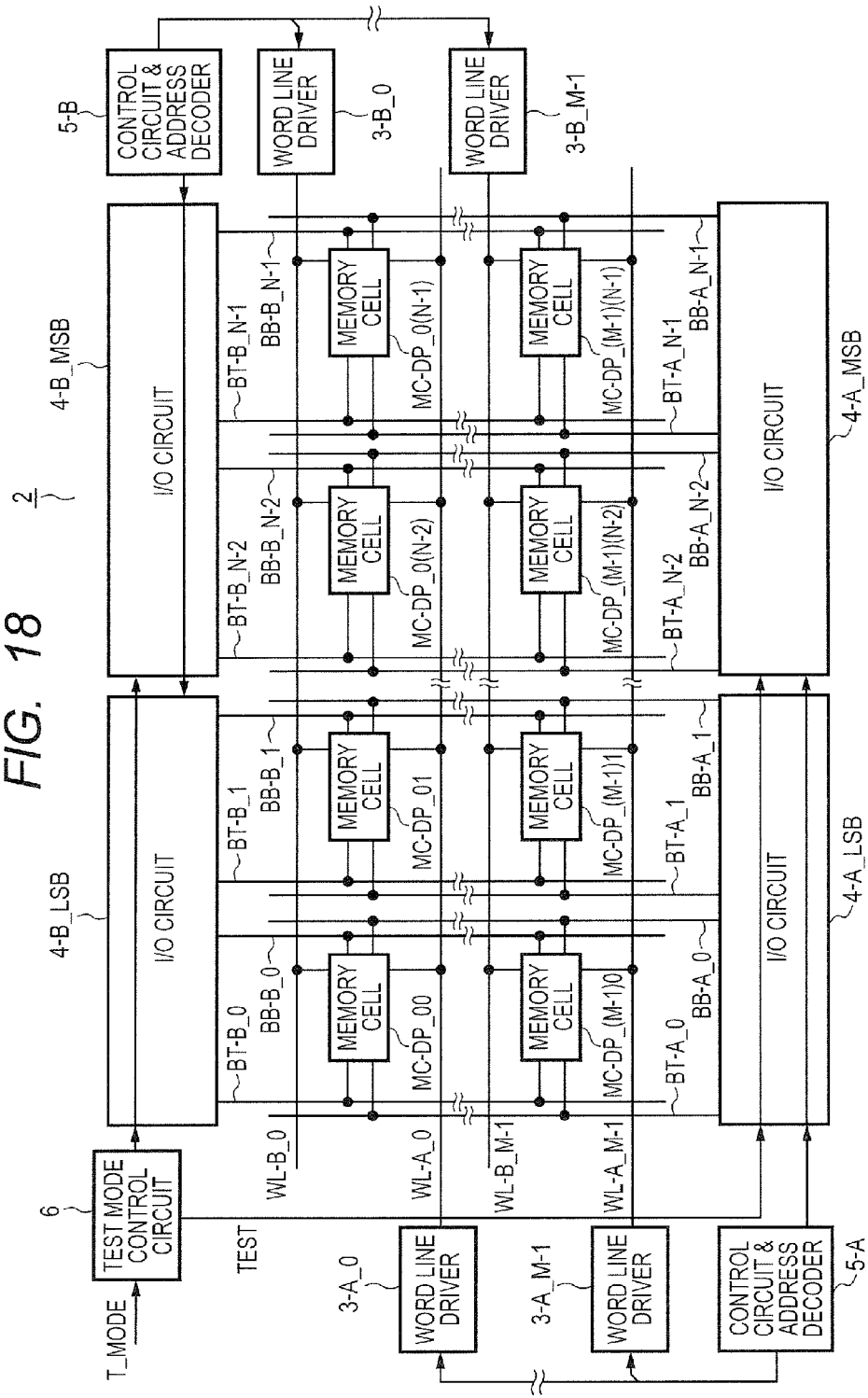
FIG. 18 is a block diagram showing a configuration example of a dual-port SRAM module which is an object to be tested.

FIG. 18 is a block diagram showing a configuration example of a dual-port SRAM module which is an object to be tested. In the same manner as in FIG. 5, the dual-port SRAM module has a configuration of M words×N bits (M and N are integers), and the memory cells are replaced by SRAM memory cells MC-DP00 to MC-DP_(M-1)(N-1). The dual-port SRAM module includes I/O circuits 4-A_LSB and 4-A_MSB on an A port side, word line drivers 3-A_0 to 3-A_M-1, a control circuit & address decoder 5-A, I/O circuits 4-B_LSB and 4-B_MSB on a B port side, word line drivers 3-B_0 to 3-B_M-1, a control circuit & address decoder 5-B, and a test mode control circuit 6. Regarding the I/O circuits 4, the word line drivers 3, and the control circuits & address decoders 5, the same circuits are mounted on the A port side and the B port side, and each circuit operates in the same manner as that in the single-port SRAM described in the first embodiment. One test mode control circuit 6 may be included in the entire dual-port SRAM module, and the test mode signal TEST is supplied to the I/O circuits on one side, for example, to the I/O circuits 4-A_LSB and 4-A_MSB on the A port side as shown in FIG. 18. On the I/O circuits 4-A_LSB and 4-A_MSB on the A port side, a circuit that raises a bit line potential of low side from the VSS (GND) level by several tens mV to one handled and several tens mV in the pseudo-low-temperature test mode as illustrated in FIG. 7 is mounted. On the other hand, the above circuit for the pseudo-low-temperature test mode is omitted from the I/O circuits 4-B_LSB and 4-B_MSB on the B port side. This is because a failure that becomes conspicuous at a low temperature is caused by a defect of a memory cell, so that it is enough if a screening test in the pseudo-low-temperature test mode can be performed from either one of the ports.

On the other hand, it may be configured so that the same circuit is mounted on the I/O circuits 4-B_LSB and 4-B_MSB on the B port side and the screening test in the pseudo-low-temperature test mode can be performed from both ports. For example, when a defect due to a bit line pair or a word line causes a failure that becomes conspicuous at a low temperature, it is possible to prevent outflow of defective products by performing the screening test in the pseudo-low-temperature test mode from both ports.

Fifth Embodiment

Figure 19:
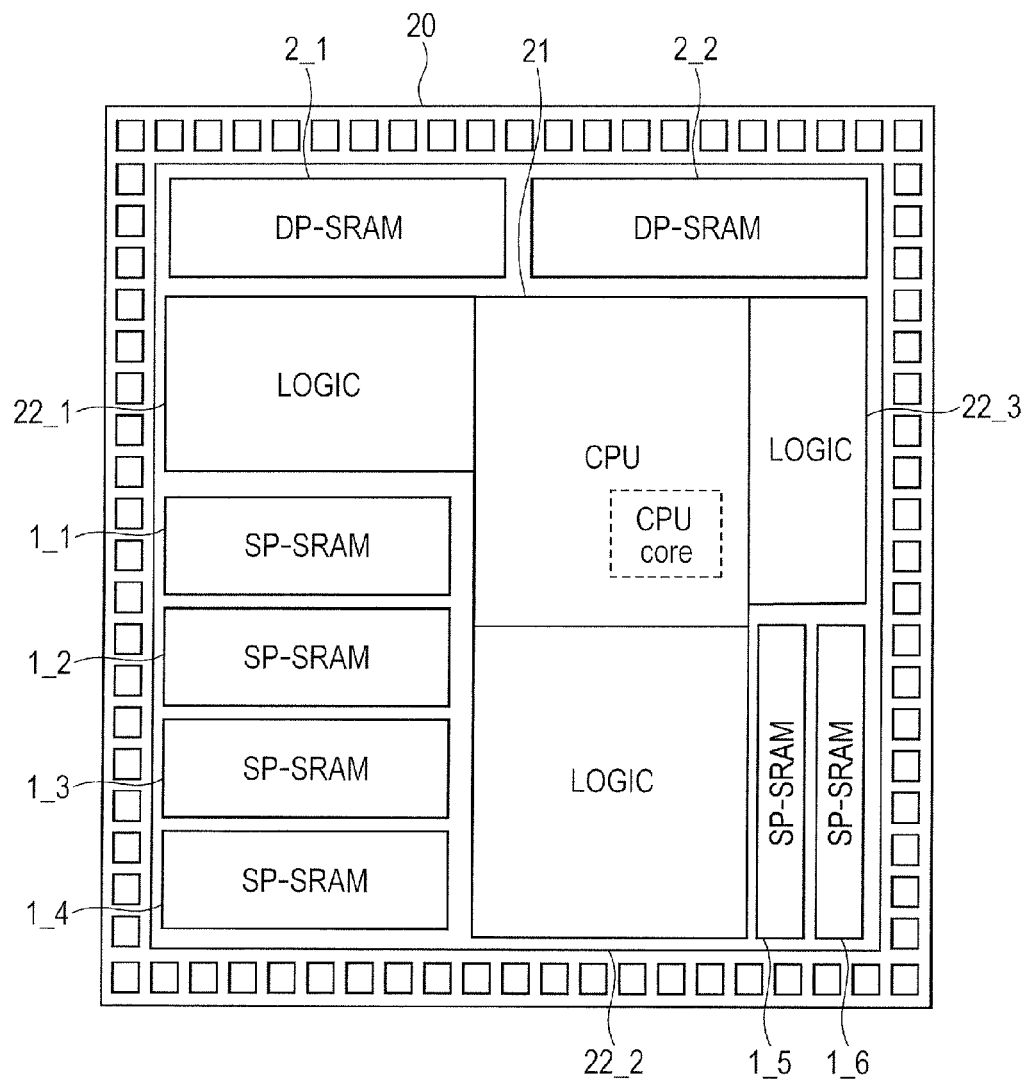
FIG. 19 is a diagram showing a layout configuration of a semiconductor chip according to a fifth embodiment.

The single-port SRAM module and the multi-port SRAM module described in the first to the fourth embodiments can be incorporated in a semiconductor chip 20 in which a system including SoC (System-on-a-Chip) and a microcomputer is formed. FIG. 19 is a diagram showing a layout configuration of the semiconductor chip 20 according to a fifth embodiment. In FIG. 19, the semiconductor chip 20 includes a CPU (Central Processing Unit) 21, single-port SRAMs (SP-SRAMs) 1_1 to 1_6, dual-port SRAMs (DP-SRAMs) 2_1 and 2_2, and logic circuits (LOGICs) 22_1 to 22_3. Here, the single-port SRAMs (SP-SRAMs) 1_1 to 1_6 are the single-port SRAMs described in the first to the fourth embodiments, and the dual-port SRAMs (DP-SRAMs) 2_1 and 2_2 the dual-port SRAMs described in the fourth embodiment. The semiconductor chip 20 may include other storage elements such as an EEPROM (Electrically Erasable Programmable Read Only Memory) in addition to SRAMs and may further include an analog circuit and the like.

The CPU 21 is also called a central processing unit and corresponds to the heart of a computer and the like. The CPU 21 reads commands from a storage device, decodes the commands, and performs various calculations and controls based on the commands. A CPU core is included inside the CPU 21 and an SRAM is incorporated inside the CPU core. A high-performance SRAM is used as the SRAM inside the CPU core. The SRAMs described in the first to the fourth embodiments are preferably used as the SRAM inside the CPU core. Of course, the SRAMs described in detail in the first to the fourth embodiments may be used for the single-port SRAMs (SP-SRAMs) 1_1 to 1_6 and the dual-port SRAMs (DP-SRAMs) 2_1 and 2_2.

By incorporating the SRAMs described in the first to the fourth embodiments into the semiconductor chip 20 in which a system including SoC and a microcomputer is formed, characteristics of the semiconductor chip 20 can be improved. When a failure that becomes conspicuous at a low temperature is significant only in the mounted SRAMs and the low temperature screening test is not required for the other circuits such as the CPU 21 and the logic circuits (LOGICs) 22_1 to 22_3, it is possible to prevent the problems of overkill and outflow of defects while omitting the low temperature screening test of the entire chip by applying the first to the fourth embodiments to all the SRAMs mounted on the semiconductor chip 20.

While the invention made by the inventors has been specifically described based on the embodiments, it is needless to say that the present invention is not limited to the embodiments and may be variously modified without departing from the scope of the invention.

What is claimed is:

1. A semiconductor device comprising:
a word line;
a bit line pair;
a memory cell arranged at a position where the word line and the bit line pair intersect with each other; and
a drive circuit that drives the bit line pair with a predetermined voltage to write data into the memory cell,
wherein a first potential and a second potential higher than the first potential are supplied to the memory cell as power sources,
wherein the semiconductor device has a first operation mode and a second operation mode,
wherein in the first operation mode, the drive circuit drives one bit line of the bit line pair toward the first potential and drives the other bit line toward the second potential, and
wherein in the second operation mode, the drive circuit drives one bit line of the bit line pair to a third potential that is higher than the first potential and lower than the second potential, and drives the other bit line toward the second potential.

2. The semiconductor device according to claim 1,
wherein the memory cell is coupled to a first and a second power source lines, has a first and a second storage nodes, and includes a first and a second P-channel MOSFETs and a first to a fourth N-channel MOSFETs,
wherein a drain electrode of the first P-channel MOSFET, a drain electrode of the first N-channel MOSFET, a source electrode of the third N-channel MOSFET, a gate electrode of the second P-channel MOSFET, and a gate electrode of the second N-channel MOSFET are coupled to the first storage node,
wherein a drain electrode of the second P-channel MOSFET, a drain electrode of the second N-channel MOSFET, a source electrode of the fourth N-channel MOSFET, a gate electrode of the first P-channel MOSFET, and a gate electrode of the first N-channel MOSFET are coupled to the second storage node,
wherein a source electrode of the first P-channel MOSFET and a source electrode of the second P-channel MOSFET are coupled to the second power source line,
wherein a source electrode of the first N-channel MOSFET and a source electrode of the second N-channel MOSFET are coupled to the first power source line,
wherein a gate electrode of the third N-channel MOSFET and a gate electrode of the fourth N-channel MOSFET are coupled to the word line,
wherein a drain electrode of the third N-channel MOSFET is coupled to one bit line of the bit line pair,
wherein a drain electrode of the fourth N-channel MOSFET is coupled to the other bit line of the bit line pair, and
wherein the first potential is supplied to the first power source line and the second potential is supplied to the second power source line.

3. The semiconductor device according to claim 2,
wherein the drive circuit includes a fifth and a sixth N-channel MOSFETs, and
wherein in the second operation mode, a current path from the second power source line to each bit line of the bit line pair is formed by turning on the fifth and the sixth N-channel MOSFETs.

4. The semiconductor device according to claim 3,
wherein the drive circuit includes a seventh and an eighth N-channel MOSFETs, and
wherein in the first and the second operation modes, a current path from the first power source line to one bit line of the bit line pair is formed by turning on the seventh or the eighth N-channel MOSFET.

5. The semiconductor device according to claim 2,
wherein the word line is defined as a first word line, the bit line pair is defined as a first bit line pair, and the semiconductor device further includes a second word line and a second bit line pair,
wherein the memory cell includes a ninth and a tenth N-channel MOSFETs,
wherein the gate electrode of the third N-channel MOSFET and the gate electrode of the fourth N-channel MOSFET are coupled to the first word line,
wherein the drain electrode of the third N-channel MOSFET is coupled to one bit line of the first bit line pair,
wherein the drain electrode of the fourth N-channel MOSFET is coupled to the other bit line of the first bit line pair,
wherein a gate electrode of the ninth N-channel MOSFET and a gate electrode of the tenth N-channel MOSFET are coupled to the second word line,
wherein a drain electrode of the ninth N-channel MOSFET is coupled to one bit line of the second bit line pair,
wherein a drain electrode of the tenth N-channel MOSFET is coupled to the other bit line of the second bit line pair,
wherein in the first operation mode, the drive circuit drives one bit line of at least one bit line pair of the first bit line pair and the second bit line pair toward the first potential and drives the other bit line toward the second potential, and
wherein in the second operation mode, the drive circuit drives one bit line of at least one bit line pair of the first bit line pair and the second bit line pair to the third potential that is higher than the first potential and lower than the second potential, and drives the other bit line toward the second potential.

6. The semiconductor device according to claim 1,
wherein a memory circuit including the word line, the bit line pair, the memory cell, and the drive circuit, a bus that supplies data to be written to the memory cell by the drive circuit in the first operation mode, and a test circuit that supplies data to be written to the memory cell by the drive circuit in the second operation mode are provided over a single semiconductor substrate.

7. A test program including a test of an SRAM including a word line, a bit line pair, a memory cell coupled to the word line and the bit line pair, and a drive circuit that drives the bit line pair,
wherein the test of the SRAM includes
a first step of writing data into a memory cell selected by asserting a selection signal on the word line by driving one bit line of the bit line pair to a high level potential and driving the other bit line of the bit line pair to a low level potential, and
a second step of writing data into a memory cell selected by asserting the selection signal on the word line by driving one bit line of the bit line pair to a high level potential and driving the other bit line of the bit line pair to a potential higher than the low level potential and lower than the high level potential.

8. The test program according to claim 7,
wherein the test of the SRAM further includes, after the second step, a third step of reading written data from the memory cell to which the data is written in the second step.

9. The test program according to claim 7,
wherein the second step further includes a period for precharging the bit line pair while maintaining an asserted state of the word line after writing data into the memory cell by asserting the selection signal on the word line.

10. The test program according to claim 7,
wherein the potential higher than the low level potential and lower than the high level potential is determined based on a lowest operation temperature in an operation range of the SRAM and the second step is performed by setting a temperature of the SRAM to a temperature higher than or equal to the lowest operation temperature.

11. A test method including a test of an SRAM including a word line, a bit line pair, a memory cell coupled to the word line and the bit line pair, and a drive circuit that drives the bit line pair,
wherein the test of the SRAM includes
a first step of writing data into a memory cell selected by asserting a selection signal on the word line by driving one bit line of the bit line pair at a high level potential and driving the other bit line of the bit line pair at a low level potential, and
a second step of writing data into a memory cell selected by asserting the selection signal on the word line by driving one bit line of the bit line pair at a high level potential and driving the other bit line of the bit line pair at a potential higher than the low level potential and lower than the high level potential.

12. The test method according to claim 11,
wherein the test of the SRAM further includes, after the second step, a third step of reading written data from the memory cell to which the data is written in the second step.

13. The test method according to claim 11,
wherein the second step further includes a period for precharging the bit line pair while maintaining an asserted state of the word line after writing data into the memory cell by asserting the selection signal on the word line.

14. The test method according to claim 11,
wherein the potential higher than the low level potential and lower than the high level potential is determined based on a lowest operation temperature in an operation range of the SRAM and the second step is performed by setting a temperature of the SRAM to a temperature higher than or equal to the lowest operation temperature.

* * * * *